United States Patent [19]

Takahashi

[11] Patent Number: 5,063,540
[45] Date of Patent: Nov. 5, 1991

[54] SEMICONDUCTOR MEMORY CIRCUIT WITH DIODE LOAD CIRCUITS

[75] Inventor: Hiroyuki Takahashi, Tokyo, Japan
[73] Assignee: NEC Corporation, Tokyo, Japan
[21] Appl. No.: 652,725
[22] Filed: Feb. 8, 1991
[30] Foreign Application Priority Data Feb. 8, 1990 [JP] Japan .................................. 2-30159

[51] Int. Cl.[5] .......................................... G11C 11/36
[52] U.S. Cl. .............................. 365/175; 365/189.09;
365/190; 365/208; 365/243; 327/270;
327/296.1
[58] Field of Search .................... 365/175, 189.09, 190,
365/207, 208, 243; 307/270, 296.1

[56] References Cited

U.S. PATENT DOCUMENTS 4,829,479 5/1989 Mitsumoto et al. ............. 365/189.09

Primary Examiner—Joseph E. Clawson, Jr.
Attorney, Agent, or Firm—Sughrue, Mion, Zinn Macpeak & Seas

[57] ABSTRACT

A semiconductor memory circuit comprises memory cells, word lines, digit line pairs, load elements, a data bus line pair and a sense amplifier. The load elements are diode type semiconductor elements, and the information of the memory cell is read by using potential difference in forward voltages of the elements.

4 Claims, 6 Drawing Sheets

SEMICONDUCTOR MEMORY CIRCUIT WITH DIODE LOAD CIRCUITS

BACKGROUND OF THE INVENTION

1. Field of the Invention

The present invention relates to a semiconductor memory circuit, and more particularly to a semiconductor memory circuit that uses micro-miniaturized elements, for which are required a high degree of integration and a high speed of operation.

2. Description of Related Art

In a semiconductor memory circuit, each memory cell is connected to corresponding one of digit line pairs and corresponding one of word lines, and each load device and sense amplifier are connected via the digit line pair.

FIG. 1 is a semiconductor memory circuit diagram in a prior art. The conventional semiconductor memory circuit includes a memory cell 1 connected to a word line WL and to a digit line pair D1 and $\overline{D1}$, a load circuit 11 and a switching circuit 12 that are connected through the digit line pair D1 and $\overline{D1}$ to a sense amplifier circuit 13. Memory cells 1A and 1B are similar to the memory cell 1; load circuits 11A and 11B are also similar to the load circuit 11; switching circuits 12A and 12B are also similar to the switching circuit 12 and digit line pairs D2 and $\overline{D2}$, D3 and $\overline{D3}$ are also similar to the digit line pair D1 and $\overline{D1}$, and so that only one set will be taken up and other sets will be omitted unless otherwise needed in the description that will follow.

First, the memory cell 1 includes a flip-flop composed of resistor elements $R_1$ and $R_2$ and N channel type insulated gate field effect transistors (hereinafter referred to "NMOS transistors" in plural case and "NMOS transistor" in singular case) MC3 and MC4 (cell transistors), and a switching means for transmission composed of NMOS transistors MC1 and MC2 connected between the digit line pair D1 and $\overline{D1}$, and the word line WL. By selecting the word line WL connected to the gates of NMOS transistors MC1 and MC2 in the memory cell 1 and the digit line pair D1 and $\overline{D1}$, cell information can be detected as a potential difference between the digit line pair D1 and $\overline{D1}$ by means of the conductance ratio of the cell transistors MC3 and MC4, and P channel type insulated gate field effect transistors (hereinafter referred to "PMOS transistors" in plural case and "PMOS transistor" in singular case) M18 and M19 as load elements in the load circuit 11 that are connected to the digit lines D1 and $\overline{D1}$.

The switching circuit 12 includes PMOS transistors M20 and M21 as the switching elements that are connected to the digit line pair D1 and $\overline{D1}$ and are supplied with a digit selection signal Y1 to their gates, a PMOS transistor M22 that connects between the digit lines, and an inverter INV which supplies the digit selection signal Y1 to the gate of the PMOS transistor M22 by inverting it. The switching circuit 12 sends out the information in the memory cell 1 to the data buses DB and $\overline{DB}$ via the switching PMOS transistors M20 and M21 that are turned on by the digit selection signal Y1. Information from a plurality of switching circuits 12, 12A and 12B is transmitted to the data buses DB and $\overline{DB}$ by means of a multiplexer operation, and then transferred to the sense amplifier circuit 13.

Moreover, the sense amplifier circuit 13 includes the input bipolar transistors Q18 and Q19, the differential amplifier bipolar transistors Q20 and Q21, the load resistor elements R9 and R10 and NMOS transistors M23 to M25 that form a constant current source for input emitter-followers and ECL current switches. In particular, the sense amplifier circuit 13 supplies a potential difference information detected between the digit lines D1 and $\overline{D1}$ as a difference potential (SB, $\overline{SB}$) to the bases of the emitter-coupled bipolar transistors Q20 and Q21 that form a differential amplifier via the input bipolar transistors Q18 and Q19 of the emitter-followers, and output it from S and $\overline{S}$ by amplifying it to a difference potential sufficient to operate an output buffer (not shown) by means of the load impedance elements R9 and R10 connected to the collectors of the bipolar transistors Q20 and Q21.

Here, the levels in which the digit lines D1 and $\overline{D1}$ are in a non-selected state go to potentials which are substantially equal with each other by means of the PMOS transistor M22 for digit line equalization whose gate receives the signal obtained by inverting a digit selection signal Y1 of the switching circuit 12 using the inverter INV, and the digit lines D1 and $\overline{D1}$ are in a standby state in order to read the information of the memory cell 1 at high speed in a selected state.

In addition, at the time of writing, by lowering the potential of either of the digit line pair D1 and $\overline{D1}$ to a potential below the threshold voltage of the flip-flop for internal level inversion in the memory cell 1, one of the NMOS transistors MC3 and MC4 that is energized of the flip-flop can be turned off and the internal state of the memory cell 1 can be inverted, so that it becomes possible to carry out writing to the memory cell 1.

In short, in the prior art semiconductor memory circuit described in the above, information within the memory cell is detected as the difference between the left and right digit line potentials determined by the conductance ratio of the load PMOS transistors M18, M19 connected respectively to the digit lines D1, $\overline{D1}$ that form a pair of left and right lines and the NMOS transistors MC1 to MC4 of the selected memory cell, and the information thus detected is input to the sense amplifier 13 via the switching PMOS transistors M20, M21.

The conventional semiconductor memory circuit described above reads the cell information as the difference between the digit line potentials that are determined by the conductance ratio of the load MOS transistors connected to the memory cell via a digit line pair and the MOS transistors within the memory cell, and leads the information to a sense amplifier. The difference between the source-drain voltages of the load MOS transistors generated by the difference between the currents that flow into the cell (cell current) from either of the left or right digit line of the memory cell, is set to be the digit line potential difference.

Now, a high-speed reading operation requires a high-speed driving of the digit lines. However, the capacitance of the diffused region of the source of a memory cell MOS transistors that is used in large number for parallel connection has a magnitude of about several tens of picofarads. Consequently, MOS transistors with high driving capability are required in order to perform high-speed charging or discharging. It should be noted further that what lifts the digit line potential to a high level is a load MOS transistor while what lowers it is a MOS transistor in the cell.

Therefore, there are disadvantages that when the transistor driving capability is raised, the potential difference between the digit lines becomes small in the former while the cell current is increased in the latter.

Because of this fact, in order to realize a circuit for high-speed reading one has to design the circuit constants so as to have a minimum digit line amplitude that permits the operation of a sense amplifier for an allowable maximum cell current.

In addition, in a semiconductor memory circuit which employs microdevices for which is required a high speed operation, when there is generated a manufacturing error to cause an unbalance in the characteristics of the left and the right MOS transistors within a cell (unbalance between MC1 and MC2, and/or unbalance between MC3 and MC4), load MOS transistors (unbalance between M18 and M19) and switching MOS transistors (unbalance between M20 and M21), there are generated deviations in the high levels and the low levels of the currents that flow in the left and the right data buses connected to the sense amplifier 13. Consequently, the minimum potential difference for detecting the information is reduced.

The nonuniformity in the device properties which has its origin in the fabrication of the devices is observed more frequently in MOS transistors. For example, in a device with gate length of $L=1.0$ $\mu$m, it is inevitable in the manufacturing process to generate an error of about $\pm 0.1$ $\mu$m. By interacting the error with other nonuniformity in characteristics, the sense amplifier input potential difference reduces to about 100 mV to 60 mV, so that it becomes necessary to design a circuit with a preset margin. When a margin is taken for each element, there arises another disadvantage that the operating speed is reduced for a circuit memory as a whole.

Moreover, even in a circuit for which an operating margin is secured, when there are generated unbalances in the device characteristics, the reading speed to have a nonuniformity depending upon the memory cell selected, which leads to a reduction in the access speed for a memory circuit as a whole. Further, this also becomes a cause for an increase in the nonuniformity of the characteristics of the products, and gives rise also to a drawback which causes a reduction in the yield.

SUMMARY OF THE INVENTION

Therefore, an object of the present invention in to provide a semiconductor memory circuit in which an adverse effect due to unbalances among transistors such as NMOS transistors constituting the memory cell is eliminated thereby realizing a high speed operation and a high production yield.

According to the present invention, there is provided a semiconductor memory circuit in which information of a memory cell connected to a selected word line and a selected digit line pair is transmitted to a sence amplifier through a data bus line pair that have collected information of a plurality of digit line pairs from a digit line pair or from each digit line pair via a switching circuit. The present semiconductor memory circuit is constructed in such a way that the information of the memory cell is read by the use of the potential difference of the forward voltages generated by supplying the cell current that is made to flow in either of the digit line pair as the difference between the forward currents of the diode type semiconductor elements using p-n junctions connected respectively to the digit line pair and the data bus line pair, and transmits the information to the sense amplifier.

DESCRIPTION OF EMBODIMENTS

Figure 1:
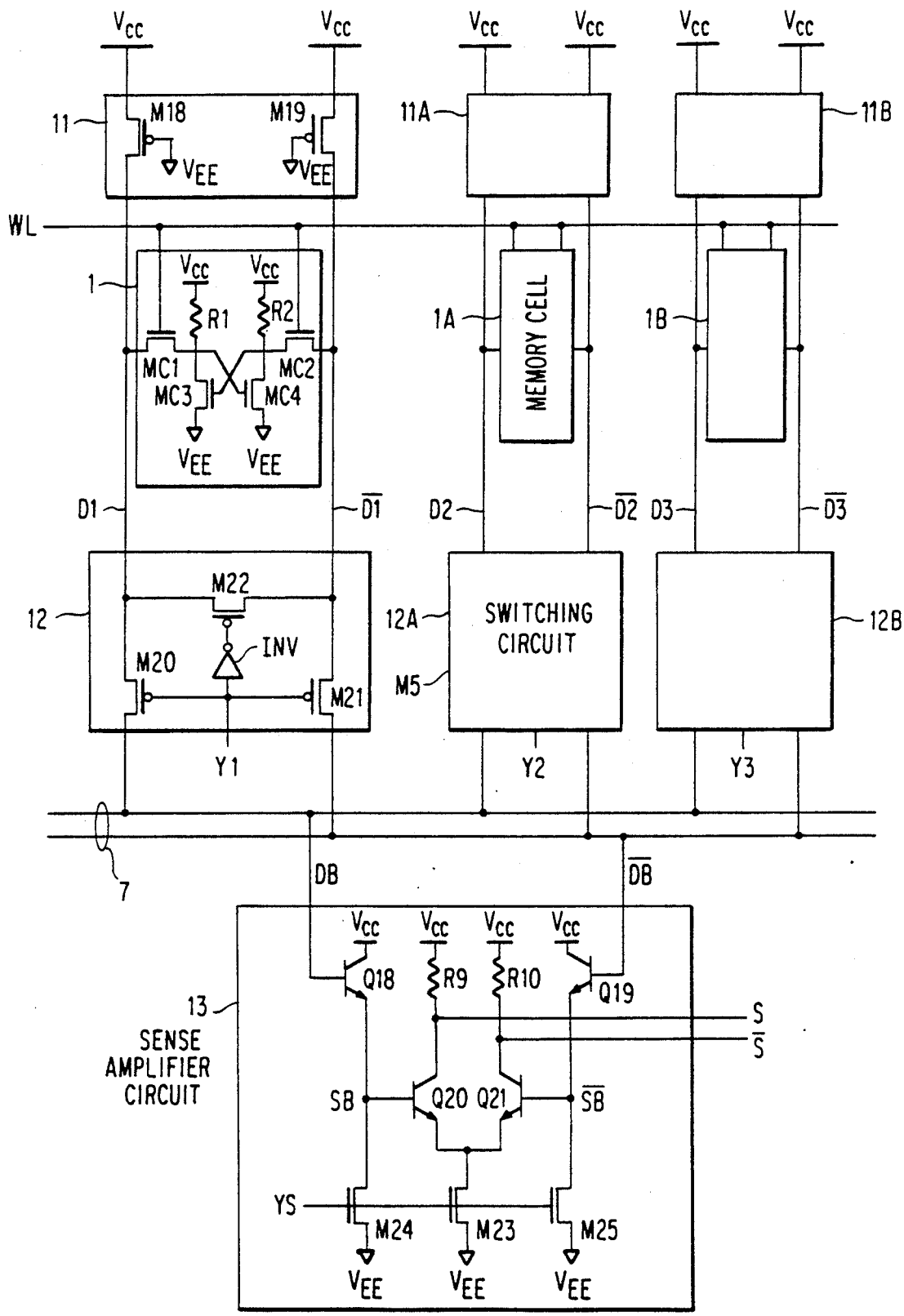
FIG. 1 is a circuit diagram showing a conventional semiconductor memory circuit.

Next, referring to the drawings, the embodiments of the present invention will be explained.

Figure 2:
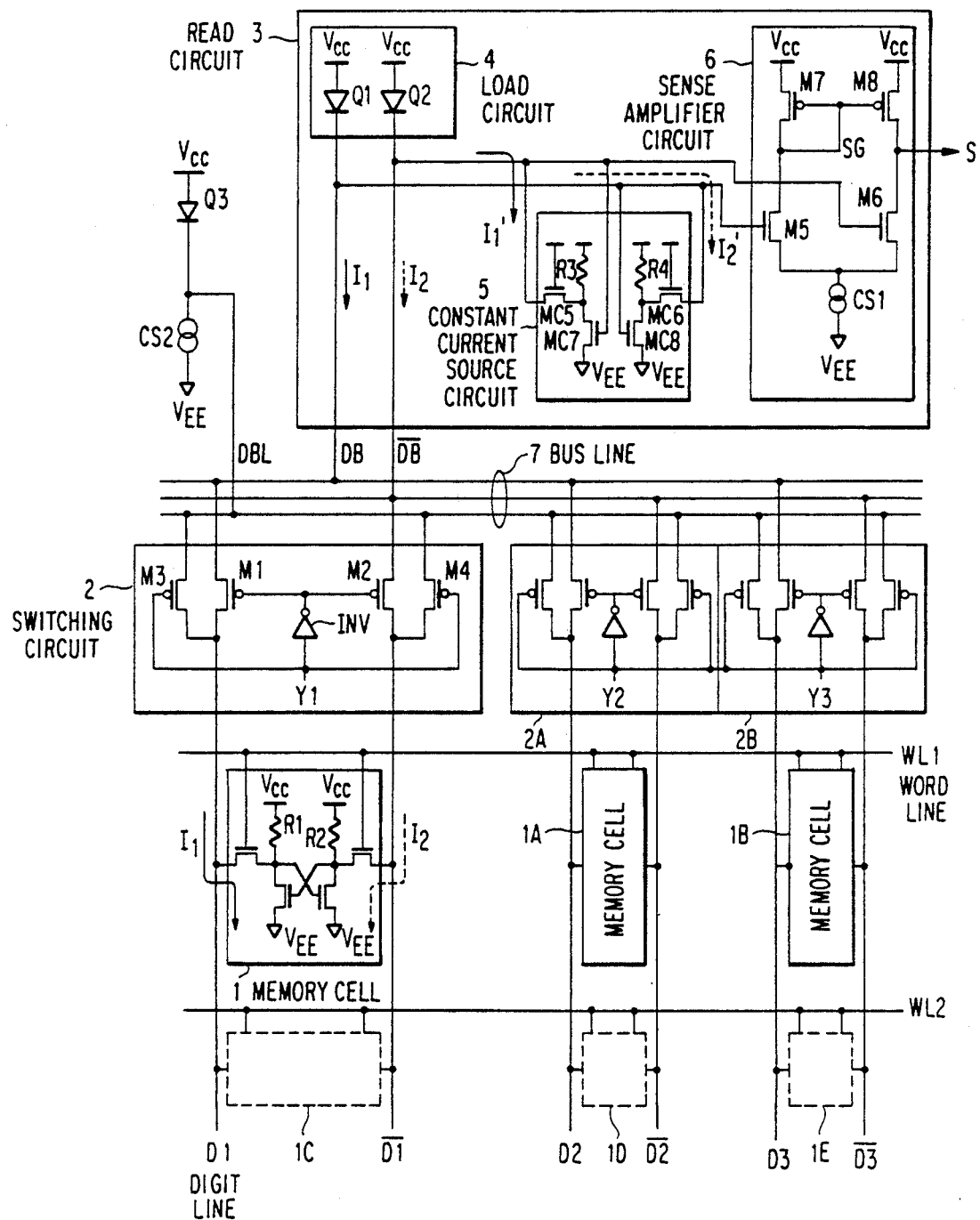
FIG. 2 is a circuit diagram showing a first embodiment of the present invention.

FIG. 2 is a circuit diagram of a semiconductor memory circuit showing a first embodiment of the present invention.

As shown in FIG. 2, the present embodiment includes memory cells 1, 1A to 1E that are arranged at the intersections of word lines WL1 and WL2, and digit line pairs D1 and $\overline{D1}$ to D3 and $\overline{D3}$, switching circuits 2, 2A and 2B that are connected between these digit line pairs and a bus line pair (DB, $\overline{DB}$) 7, and a read circuit 3 which includes a load circuit 4 connected to the bus line pair 7, a constant current source circuit 5 and a sense amplifier circuit 6.

Now, a reading operation will be described.

First, the memory cells 1, 1A to 1E (description will be given about the memory cell 1 as the representative hereinafter) are constructed by a flip-flop type memory information holding part which has NMOS transistors MC3 and MC4 and resistor elements RC1 and RC2, and NMOS transistors MC1 and MC2 for information transmission connected between the flip-flop type memory information holding part and digit lines D1 and $\overline{D1}$. The gates of the NMOS transistors MC1 and MC2 are connected to the word line WL1, and a memory cell array is formed by arranging a plurality of these memory cells, word lines and digit line pairs in matrix form. The digit lines D1 and $\overline{D1}$ are connected to the digit line switching circuit 2 which is switched by a Y1 signal, and, at the time of selection, they are connected respectively to data bus line pair DB and $\overline{DB}$ which collect the information of the digit lines via an inverter INV and PMOS transistors M1 and M2. Further, at the time of nonselection of the switching circuit 2, the digit lines D1 and $\overline{D1}$ are connected via PMOS transistors M3 and M4 to a DBL (Data Bus Low Level) line which is set at a potential for digit line non-selection, that is, at a standby potential. The data buses DB and $\overline{DB}$ connected to the digit lines that are selected by a multiplexer operation by means of a plurality of the dight line switching circuits 2, 2A and 2B are connected to the cathodes of diode type semiconductor elements (load diodes), such as the Q1 and Q2 that are p type - n type semiconductor junction diodes. When the anode side terminals are connected to a highest potential Vcc, the data bus line pair DB and $\overline{DB}$ are fixed to Vcc minus about 0.8 V, and the digit lines D1 and $\overline{D1}$ are brought to the potentials that are determined by the conductance ratio of the switching PMOS transistors M1 and M2, and the NMOS transistors for transmission MC1 and M2 and the NMOS transistors for data holding MC3 and MC4. Since either of the left and right data holding NMOS transistors MC3 and MC4 that form a pair within the memory cell 1 is energized, such reading of the information of the memory cell 1 is detected as the difference between the forward voltages of the load diode pair Q1 and Q2 generated by the presence or absence of the cell currents $I_1$, $I_2$, for example, of 0.1 mA, respectively, that flows from the digit on the energized side to a lowest voltage $V_{EE}$ through the memory cell 1, namely, as the potential difference between the data buses DB and $\overline{DB}$. The load diodes Q1 and Q2 are connected to a constant current source circuit 5 including NMOS transistors MC5 to MC8 that simulate the memory cell structure and resistance elements RC3 and RC4, for keeping a minute offset current $I_1'$, $I_2'$, for example, of 0.001 mA (1 $\mu$A), respectively, to be passed even when there are flowing no cell currents, so that unstable floating state is avoided. Namely, when a cell current $I_1$ is flowing in the load diode Q1 (in total $I_1 + I_2'$), there is flowing its offset current $I_1'$ alone in the load diode Q2. The value of the offset current $I_1'$ is determined by the NMOS transistors MC5 and MC7 which have the direction and the shape same as those of the NMOS transistors except the width, for example that are on the energized side of the selected memory cell 1. When a part of the device parameters, for example, the gate channel width W of the MC1 and the MC5, is set to an appropriate preset constant value; for example, the ratio of the width of the MC1 to that of MC5 is 100 to 1, absolute value of the impedances of these NMOS transistors MC1, MC5 are sufficiently large compared with the impedances of the MOS transistors for cell holding or the impedances of the switching MOS transistors, so that the current ratio of $I_1$ and $I_1'$ becomes equal to the preset constant value. For example, when the constant is set to 100, the offset current $I_2'$ that flows in the diode Q1 is sufficiently small compared with $I_1$ and can be ignored, so that the current ratio of the load diodes becomes equal to 100. Accordingly, the potential of the data bus DB becomes about 120 mV lower than that of the data bus $\overline{DB}$, and this potential difference is input to the sense amplifier circuit 6. The sense amplifier circuit 6 shown in this embodiment amplifies the potential difference which enters the gates of the NMOS transistors M5 and M6 by the use of a current mirror circuit formed by the PMOS transistors M7 and M8, and outputs the result from an output terminal S. The amplified output becomes a data output through an output buffer. It should be mentioned that the case in which the output S of the sense amplifier circuit 6 has one terminal is shown in this example, but it may have two terminals (S and $\overline{S}$).

Here, the potential DBL for non-selection is set to Vcc minus about 0.8 V which is the same level as at the time of selection by means of a diode Q3 that simulate the load diodes Q1 and Q2, and all of the digit lines in the non-selected state are clamped at this voltage.

Next, the internal switching will be described by making reference to the change in time of the potential waveform.

Figure 3:
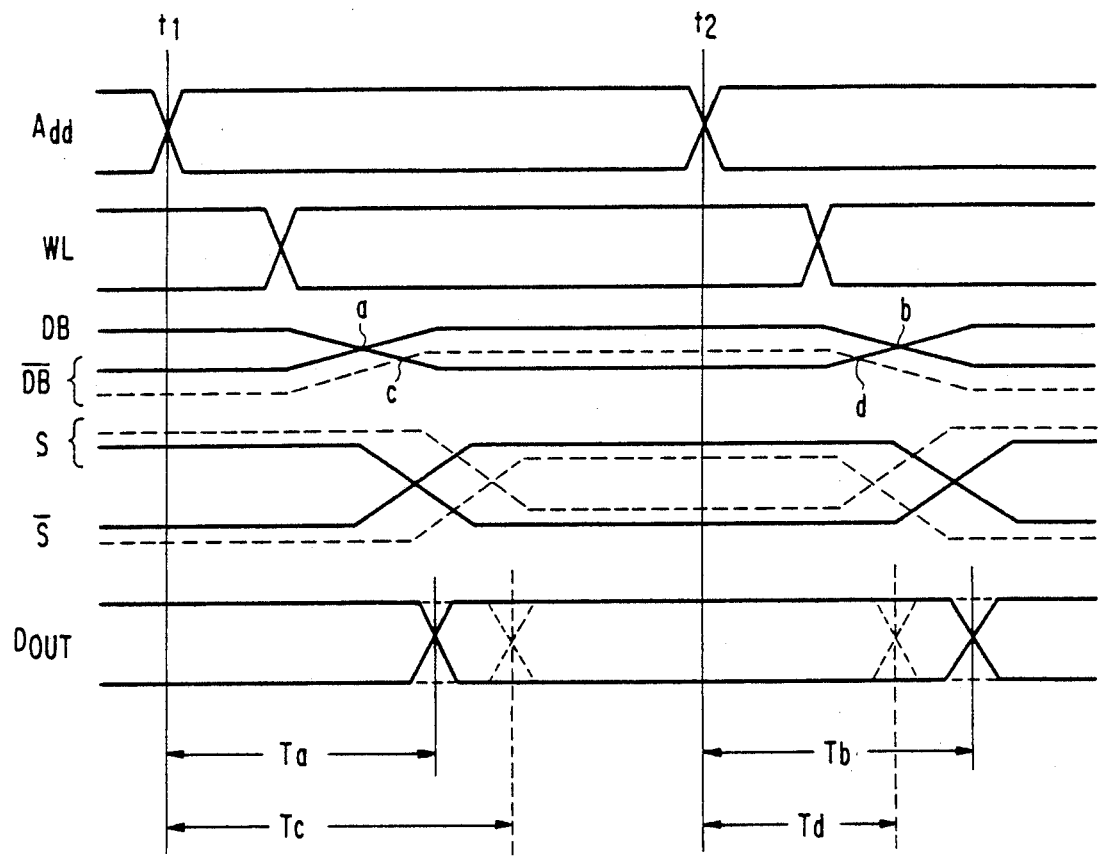
FIG. 3 is a timing chart showing internal potentials during a reading operation in the semiconductor memory circuit.

FIG. 3 is a timing chart of the internal potential for describing the read operation of the semiconductor memory circuit.

As shown in FIG. 3, the operation of word address access will be dealt with in the following.

First, when the address input is switched at the respective times of t1 and t2, the word line WL is switched with a delay through a decoder. As a result of this operation, the selected cell is shifted, and the height relationship of the potentials that appear on the digit lines and the data bus lines is inverted. The waveforms of DB and $\overline{DB}$ shown in the figure represent above-mentioned situation, and the amplitudes of the potentials are suppressed to small values of about 100 mV in order to have a switching at high speed, in view of the slow speed of the potential change due to a large capacitance added to the digit lines. These signals are amplified by the sense amplifier 6, and are taken out as outputs S and $\overline{S}$ ($\overline{S}$ is not shown an FIG. 2). The data outputs are switched upon receipt of these signals, and the times up to these points represent the address access times Ta to Td. Here, when there is generated an unbalance in the high and low potentials of the data buses DB and $\overline{DB}$ that forms a pair, namely, when the potential of $\overline{DB}$ is reduced as shown by the broken line in the figure, the data bus switching points respectively more from point a to point c, and from point b to point d, and the address access times from Ta to Tc, and from Tb to Td so that the address access time is increased by an amount (Tc−Ta). Note that in the balanced state one has Ta=Tb. Further, when the amount of unbalance is increased, the level amplitude of the output $D_{OUT}$ is reduced beyond the capability range of the sense amplifier 6, and eventually a malfunction is brought about.

In the prior art circuit shown in FIG. 1 described above, the potential difference between the data buses DB and $\overline{DB}$ varies as much as about 40 mV at the worst for 100 mV by the nonuniformity in the device characteristics generated between paired devices such as the MOS transistors in the memory cell, the load MOS transistors and the switching MOS transistors. As a result, there is also generated a delay of more than several nanoseconds. In addition, it becomes necessary to increase the amplitude of the data buses DB and $\overline{DB}$ to about 150 mV in order to secure the margin with the capability limit of the sense amplifier 6, which also generates a delay of several nanoseconds in the address access time T.

Next, referring to FIG. 4, such a potential setting for the data buses DB and $\overline{DB}$ of the present invention will be described.

Figure 4:
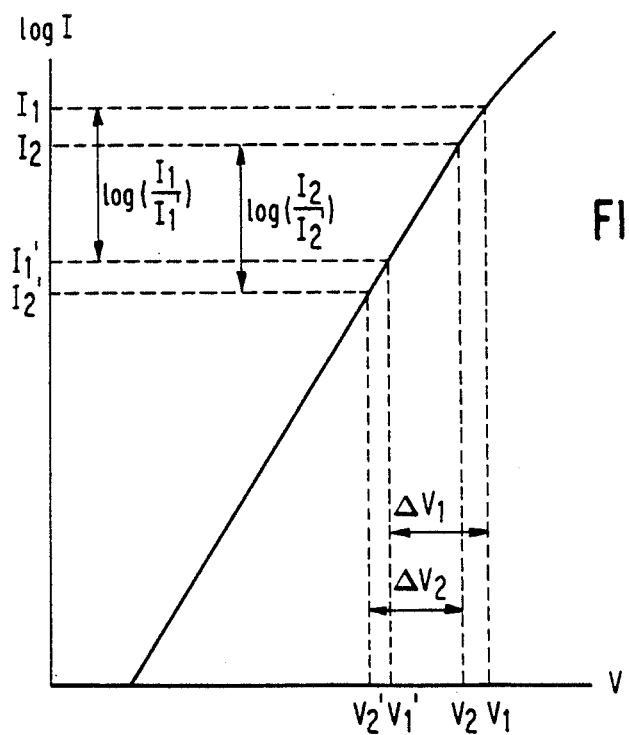
FIG. 4 is a diagram showing forward current vs voltage characteristics of the diode in the load circuit of FIG. 2.

FIG. 4 is a diagram for the forward current-voltage characteristic of a p-n junction diode constituting a load circuit shown in FIG. 2.

As shown in FIG. 4, in the current region where the series resistance component of the diode can be neglected, the current obeys the following Eq. (1).

$$I = I_s \left( \exp \frac{qV}{KT} - 1 \right) \tag{1}$$

Further, the potential difference $\Delta V$ generated by the cell current I and the offset current I' is given by the following Eq. (2).

$$\Delta V = \tag{2}$$

-continued $$\frac{kT}{q}\left\{\log I - \log I' + \log\left(1 + \frac{I_s}{I}\right) - \log\left(1 + \frac{I_s}{I'}\right)\right\} \simeq$$

$$\frac{kT}{q}\{\log I - \log I'\}$$

$$(I >> I_s \text{ and } I' >> I_s) \propto K \log\left(\frac{I}{I'}\right) (K: \text{const.})$$

In Eq. (1) and Eq. (2);
$I_s$: BJT saturation current
q : Elementary charge
V : p-n forward voltage
k : Boltzmann constant
T : absolute temperature
I : p-n forward current Therefore, the potential difference between the data buses DB and $\overline{\text{DB}}$ is determined by I/I' provided that the cell current I is sufficiently large compared with the offset current I'. Namely, the cell current I is roughly determined by the NMOS transistors that constitute the cell so that even when there exists an unbalance of the characteristics between the left and the right MOS transistors and the unbalance leads to the cell unbalance currents of $I_1 \neq I_2$, the values of the current ratios $I_1/I_1'$ and $I_2/I_2'$ can be hardly affected by the unbalance. Therefore, from Eq. (2), a relation of $\Delta V_1 = \Delta V_2$ is satisfied. Moreover, there is hardly generated a difference (within several millivolts) in the forward voltages of the load diodes, so that it is possible to reduce the amplitudes of the data buses DB and $\overline{\text{DB}}$ to the vicinity of the limit of the sense amplifier operation, and realize a high-speed operation. Further, the devices for raising the potentials of the digit lines D1 and $\overline{\text{D1}}$ and the potentials of the data bus lines DB and $\overline{\text{DB}}$ are the load diodes Q1 and Q2. A p-n junction element has a higher current supply capability than a MOS transistor, and in one semiconductor chip, deviation of characteristics among p-n junction elements are far small than that among MOS transistors. Therefore, these are optimum as the high-speed driving elements of the high capacity portions which will enable to obtain a substantial increases in the operating speed and a stability of the characteristics.

In short, in accordance with the present embodiment, diodes type semiconductor elements such as the p-n junction type diodes are used as load devices by connecting then in the forward direction. Further, if need arises, a digit line switching MOS transistor is installed between the diode type semiconductor element, namely, the load diode, and the digit line, which is connected to the load diode via a data bus which collected the digit information. Moreover, the potential difference between the forward voltages generated in the load diodes that form a left and right pair may be directly input to the sense amplifier without the intermediary of an MOS transistor switching circuit. Still further, offset currents that flow in these load diodes may be supplied in the present embodiment by installing constant current sources that simulate the cell. Therefore, according to the present embodiment, even if unbalance in characteristic among the MOS transistors in the switching circuit 2 exists, the potential difference DB/$\overline{\text{DB}}$ inputting the sense amplifier circuit 6 is not affected by the unbalance because the difference DB/$\overline{\text{DB}}$ is determined by the ratio of currents flowing the load diodes Q1 and Q2.

Figure 5:
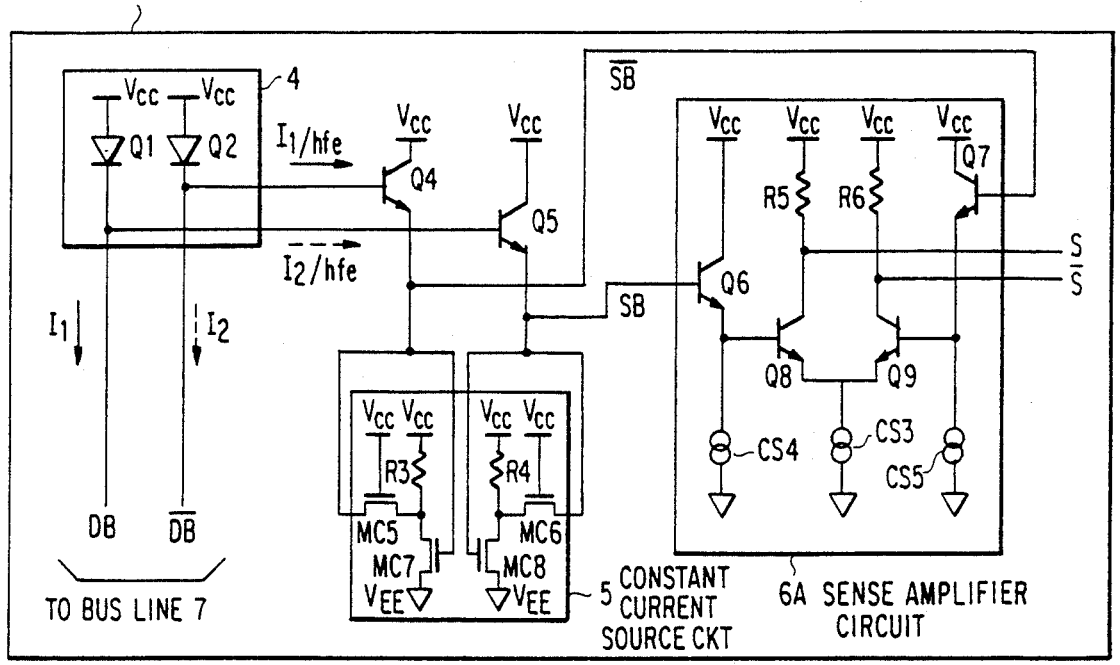
FIG. 5 is a circuit diagram showing a read circuit in a second embodiment of the present invention.

FIG. 5 is a read circuit diagram in the semiconductor memory circuit for describing a second embodiment of the present invention.

As shown in FIG. 5, the present embodiment has, in comparison with the first embodiment in FIG. 2, the sense amplifier 6A constructed by bipolar transistors Q6 to Q9, and bipolar transistors Q4, Q5 for switching installed between the load circuit 4 and the constant current source 5. Namely, signals are supplied to a bipolar differential amplifier type sense amplifier circuit 6A from the cathodes of the load devices Q1 and Q2 through bipolar transistors Q4 and Q5 that are emitter-follower connected and through the wirings of SB and $\overline{\text{SB}}$. The operation of the sense amplifier circuit 6A is the same as that of the sense amplifier 13 of the prior art shown in FIG. 1 described above. Since a circuit which is precisely the same as that of the memory cell 1 (FIG. 2) is used as the current sources 5 for the emitter-follower, the level of the currents from the constant current sources 5 are the same as the level of the cell currents. The offset currents of the load diodes Q1 and Q2 become the base currents of the transistors Q4 and Q5, being $I_1/h_{fe}$ and $I_2/h_{fe}$ for the cells on the left and the right, respectively. Therefore, the potential difference of the load diodes Q1 and Q2 is given by $$\Delta V \propto K \log (h_{fe}) \tag{3}$$

from Eq. (2) explained before, and is controlled exclusively by the amplification factor $h_{fe}$ of the bipolar transistors Q4 and Q5. Ordinarily, $h_{fe}$ is about 100 so that the potential difference $\Delta V$ of the load diodes Q1 and Q2 becomes about 120 mV and a required potential difference can sufficiently be obtained. At this time, the currents of the current sources CS4 and CS5 for the input emitter-followers of the sense amplifier circuit 6A are about several hundred microamperes, and therefore, the base currents of the bipolar transistors Q6 and Q7 become several microamperes which values are sufficiently small comparing with the emitter currents of the bipolar transistors Q4 and Q5, and hence can be neglected. Since, the above-mentioned sense amplifier circuit 6A is an ECL circuit, it is possible to realize a sufficiently high speed switching with a potential difference of about 100 mV.

Figure 6:
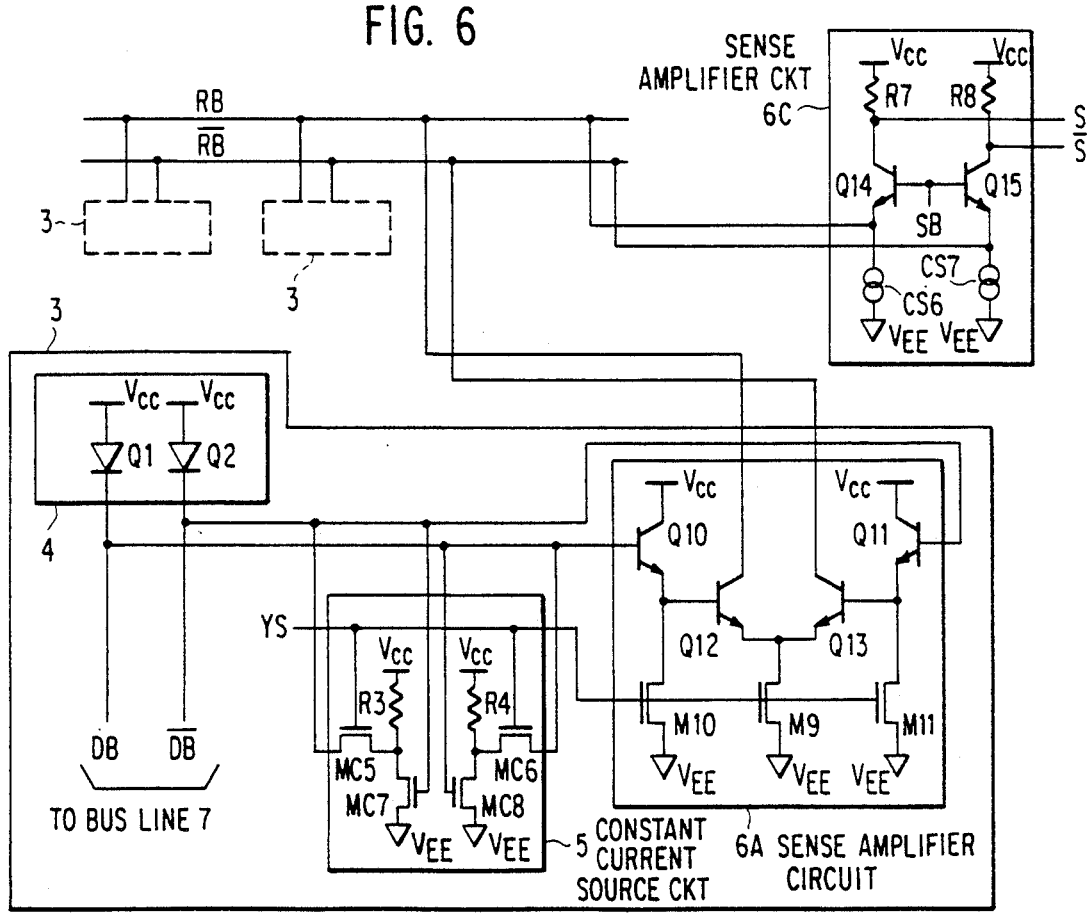
FIG. 6 is a circuit diagram showing read circuits, a sense amplifier circuit and a connecting means therebetween in a third embodiment of the present invention.

FIG. 6 is a read circuit diagram of a third embodiment of the present invention, and is similar to FIG. 5.

As shown in FIG. 6, the present embodiment is an example of a large capacity memory circuit which is formed by assembling a plurality of read circuit blocks 3, with one read circuit block 3 being formed by the circuit up to the sense amplifier circuit 6B. The load diodes Q1 and Q2 that constitute a load circuit 4, a constant current source circuit 5 for offset current and a sense amplifier circuit 6B are substantially the same as the first or the second embodiment described in the above. The difference is that the outputs from the sense amplifier circuit 6B are taken out from the collectors of bipolar transistors Q12 and Q13 to read buses RB and $\overline{\text{RB}}$, to which many read circuit blocks 3 are connected at their collectors of bipolar transistors Q12 and Q13. From the read buses RB and $\overline{\text{RB}}$, difference currents are input to emitters of bipolar transistors Q14 and Q15 constituting a differential amplifier of a sense amplifier circuit 6C. The bases of the bipolar transistors Q14 and Q15 are commonly connected to each other and keep a base potential SB. From the sense amplifier circuit 6C, amplitude output signals S and $\overline{S}$ obtained by the bipolar transistors Q14 and Q15, resistor elements R7 and R8 and constant current source circuits CS6 and CS7 are output.

In such a large capacity memory circuit, the current quantity in the nonoperating region becomes of concern. In the present circuit a common block selection signal YS is supplied to the gates of all of the NMOS transistors M9 to M11 for constant current sources of the sense amplifier circuit 6B and the NMOS transistors MC5 and MC6 of the constant current source circuit 5 for offset current, so that the current in the block that flows at the time of block nonselection becomes substantially zero and it is possible to realize a lower-power and a high-speed memory circuit.

Figure 7:
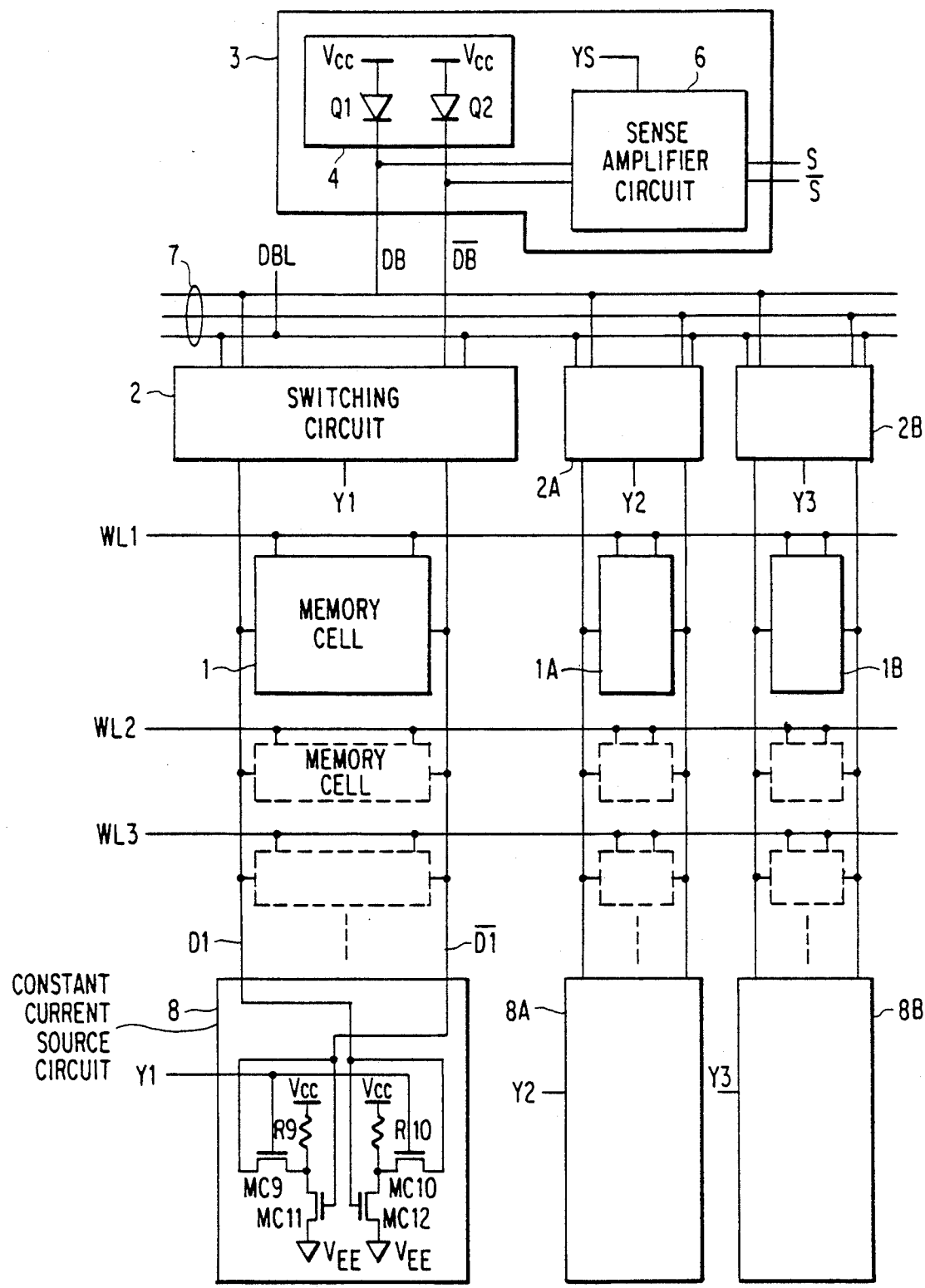
FIG. 7 is a circuit diagram showing a fourth embodiment of the present invention.

FIG. 7 is a semiconductor memory circuit diagram showing a fourth embodiment of the present invention.

As shown in FIG. 7, the present embodiment is an example of a circuit in which a constant current source for offset current of a load diode that constitutes a load circuit 4 is provided for each of the digit line pairs D1 and $\overline{D1}$ to D3 and $\overline{D3}$ in order to generate more accurate data for the ratios of the cell currents $I_1$ and $I_2$ (FIG. 2) and the offset currents $I_1'$ and $I_2'$ (FIG. 2). In this case, the constant source circuits 8, 8A and 8B are selected by the use of selection signals Y1 to Y3 of the switching circuits 2, 2A and 2B for digit line selection. Accordingly, a selection memory cell 1 and the constant current source circuit 8 which simulates the memory cell 1 as in FIG. 2 are connected to the same digit line pair D1 and $\overline{D1}$, and there can be obtained a data bus amplitude with small nonuniformity in the output and a characteristic with more stable access speed. Moreover, there hardly needed any increase in the current of the constant current source circuit.

Figure 8:
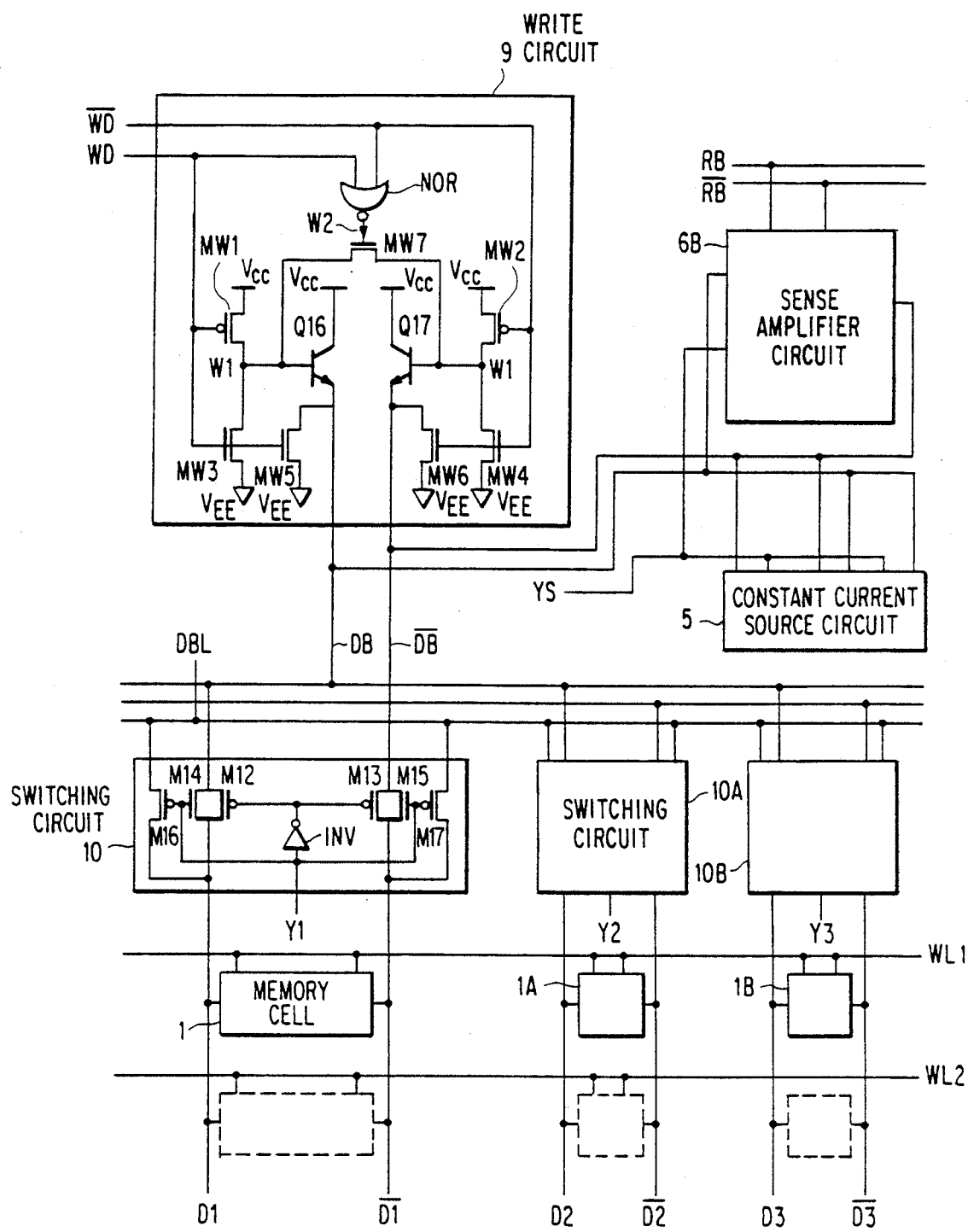
FIG. 8 is a circuit diagram showing a fifth embodiment of the present invention.

FIG. 8 is a semiconductor memory circuit diagram showing a fifth embodiment of the present invention.

As shown in FIG. 8, the embodiment is an example of applying the present invention to a circuit for write operation. In the present embodiment, the load diode part forms a write circuit 9, and the constitution of a digit line switching circuit 10 differs from those of the first to the fourth embodiments.

First, at the time of write, in order to lower the potential of the digit line D1 or $\overline{D1}$ to the vicinity of $V_{EE}$, there are provided NMOS transistors M14 and M15 in parallel with PMOS transistors M12 and M13 in the switching circuit 10. With this arrangement, even when the potentials of the digit lines D1 and $\overline{D1}$ and the data buses DB and $\overline{DB}$ are lowered to near $V_{EE}$, the continuity capability with the data bus pair DB and $\overline{DB}$ is secured sufficiently high. Such lowering of the potentials of the digit lines D1 and $\overline{D1}$ is carried out by lowering the potential of one of the data buses DB and $\overline{DB}$ via the switching circuit 10.

What controls the above-mentioned operation and carries out the switching between the read state and the write state is the write circuit 9, and the control signals for these purposes are WD and $\overline{WD}$.

When the control signals WD and $\overline{WD}$ are at a low level (potential $V_{EE}$), the system is in the read state where the PMOS transistors MW1 and MW2 are turned on and the potentials of the nodes W1 and $\overline{W1}$ are raised to Vcc. Accordingly, npn bipolar transistors Q16 and Q17 that have this potential as the base potential are brought to a diode connection, respectively, and there is generated a potential difference between the data bus line pair DB and $\overline{DB}$ with these as load diodes by p type base-n type emitter (p-n junction diode) of Q16 and Q17. Further, at this time, the output W2 of a NOR gate that has the control signals WD and $\overline{WD}$ as the inputs energizes an NMOS transistor MW7 for equalizing the potentials between the bases of the p-n junction load diodes Q16 and Q17, removes a minute base potential difference due to an unbalance between the PMOS transistors MW1, MW2, and eliminate a nonuniformity due to MOS transistors.

On the other hand, at the time of write, either of the control signals WD and $\overline{WD}$ is raised to a high level (potential Vcc) by the write data. For example, when WD is brought to the high level, an output W1 of the CMOS inverter including the PMOS transistor MW1 and the NMOS transistor MW3 in the write circuit 9 goes to the low level, and an NMOS transistor MW5 is turned on at the same time when the bipolar transistor Q16 is turned off, so that the charges on the data bus line DB and the digit line D1 are discharged and their potentials are lowered to the low ($V_{EE}$) potential. The NMOS transistor MW7 for equalization is de-energized at this time.

Further, as to the recovery operation from the write state to the read state, the PMOS transistor MW1 and the NMOS transistor MW7 in the write circuit 9 are energized and W1 which is the base potential of the bipolar transistor Q16 is raised, so that the potentials of the data bus DB and the digit line D1 are quickly elevated by the action of the high capability bipolar transistors, making it possible to enter the read state.

Moreover, in the write state there is absolutely no increase in the DC current due to a through current in a constant current source circuit 5 for offset current and a sense amplifier circuit 6B besides the write circuit 9. Accordingly, it is possible to realize a high-speed and low-power write circuit without the need for installing anew bus lines and the like.

As described in the above, the semiconductor memory circuit in accordance with the present invention, a load circuit for the memory cell transistors is formed by the use of diode type semiconductor elements, and the memory cell information is read by means of a forward potential difference that is generated according to the ratio of the currents that flow in the diode type semiconductor element pairs of the load circuit. Therefore, it becomes possible to eliminate the read potential fluctuations due to unbalances in the characteristics of the paired transistors in the memory cells and on the digit line pairs. Further, the present invention has an effect that enables the realization of a read operation at high speed and with small nonuniformity of the velocity.

Moreover, in accordance with the semiconductor memory circuit of the present invention, it becomes possible to drive the data bus lines and the digit lines with large capacity load, by forming a diode type semiconductor element pair that forms a load circuit with bipolar transistors, and by using these read circuit systems as a part of the write circuit. Therefore, the present invention has an effect of realizing a high-speed write operation and a recovery operation from the writing mode using a small number of elements.

What is claimed is:

1. A semiconductor memory circuit transmitting information in a memory cell connected to a selected word line and a selected digit line pair to a sense amplifier through a data bus line pair, wherein the information of said memory cell is read by sensing a potential difference generated at load diodes by supplying a cell current through either of said digit line pair in accordance with memory data of said memory cell, said load diodes being respectively connected to said digit line pair or data bus line pair as load elements to supply the information stored in said memory cell to said sense amplifier.

2. A semiconductor memory circuit as claimed in claim 1, wherein a constant current circuit which simulates the memory cell is further provided so as to let a minute current as an offset current flow in both said diode devices, constantly.

3. A semiconductor memory circuit as claimed in claim 1, in which said diode devices are bipolar transistors, said bipolar transistors are used to execute the operation of lowering the potential of either one of a selected digit line pair to the vicinity of a lowest potential and the operation of recovering the potential to the original value after the completion of writing either directly by means of said digit line pair or via a data bus line that collected information of a plurality of digit line pairs in order to write a data to a selected memory cell.

4. A semiconductor memory circuit comprising:
a memory cell arranged at the intersection of a digit line pair and a word line;
a switching circuit connected to said digit line pair;
a load circuit having PN-junction diode connected to said switching circuit via a bus;
a constant current source circuit for supplying an offset current that flows in the diode of said load circuit; and
a sense amplifier connected to said load circuit and amplifies the potential difference generated by the current that flows in said diode.

* * * * *

UNITED STATES PATENT AND TRADEMARK OFFICE
CERTIFICATE OF CORRECTION

PATENT NO. : 5,063,540
DATED : November 5, 1991
INVENTOR(S) : Hiroyuki TAKAHASHI It is certified that error appears in the above-identified patent and that said Letters Patent is hereby corrected as shown below:

Col. 1, lines 21, 23, 29, 39, 42, 44, 50, 53,
Col. 2, lines 15, 21, 25, 37,
Col. 4, lines 46, 51, 58
Col. 5, line 2
Col. 7, line 37 and
Col. 9, line 33, 46, 50, 54, delete the second occurrance of "D1" and insert --$\overline{D1}$--.

Col. 1, line 28, delete "D2, D3, and D3" and insert --$\overline{D2}$, D3, and $\overline{D3}$--.

Col. 2, line 6, delete "D1" and insert --$\overline{D1}$--.

Col. 4, line 33 and
Col. 9, line 23, delete "D1 to D3 and D3" and insert --$\overline{D1}$ to D3 and $\overline{D3}$--.

Col. 9, line 64, delete the second occurrence of "W1" and insert --$\overline{W1}$--.

Signed and Sealed this

Seventh Day of September, 1993

Attest:

BRUCE LEHMAN

Attesting Officer    Commissioner of Patents and Trademarks